US011018679B1

(12) United States Patent
Jayakumar (10) Patent No.: US 11,018,679 B1
(45) Date of Patent: May 25, 2021

(54) ON-CHIP PHASE-LOCKED LOOP RESPONSE MEASUREMENT

(71) Applicant: Silicon Laboratories Inc., Austin, TX (US)

(72) Inventor: Kannanthodath V. Jayakumar, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/697,613

(22) Filed: Nov. 27, 2019

(51) Int. Cl.
H03L 7/06 (2006.01)
H03L 7/099 (2006.01)
H03L 7/07 (2006.01)

(52) U.S. Cl.
CPC .............. *H03L 7/0993* (2013.01); *H03L 7/07* (2013.01)

(58) Field of Classification Search
CPC ................................ H03L 7/0993; H03L 7/07
USPC ......................................................... 327/147
See application file for complete search history.

(56) References Cited

U.S. PATENT DOCUMENTS

| | | | |
|---|---|---|---|
| 5,656,977 A | 8/1997 | Kelkar et al. | |
| 6,278,746 B1 | 8/2001 | Velez | |
| 7,323,946 B2 | 1/2008 | Seefeldt et al. | |
| 7,405,628 B2 | 7/2008 | Hulfachor et al. | |
| 8,552,767 B1 | 10/2013 | Nikaeen | |
| 8,791,734 B1 | 7/2014 | Hara et al. | |
| 10,498,297 B2 | 12/2019 | Berkhout et al. | |
| 10,608,649 B1 | 3/2020 | Jayakumar et al. | |
| 2002/0027886 A1 | 3/2002 | Fischer et al. | |
| 2008/0068236 A1* | 3/2008 | Sheba | G04F 10/005 341/118 |
| 2013/0063192 A1* | 3/2013 | Ferriss | H03L 7/0891 327/157 |

OTHER PUBLICATIONS

U.S. Appl. No. 16/580,161, filed Sep. 24, 2019, entitled "Accurate and Reliable Digital PLL Lock Indicator," by inventor Kannanthodath V. Jayakumar.

* cited by examiner

*Primary Examiner* — Metasebia T Retebo
(74) *Attorney, Agent, or Firm* — Zagorin Cave LLP (57) ABSTRACT

An integrated circuit includes an on-chip PLL response measurement capability. The PLL response is determined in terms of PLL bandwidth and PLL peaking. A digital phase offset is inserted to a digital representation of a first clock signal to create a phase step. A phase and frequency detector of a phase-locked loop (PLL) supplies a phase error signal indicative of a difference between the first clock signal and a second clock signal. The elapsed time between the phase step insertion and the first zero crossing of the phase error as the PLL tries to deal with the is used to determine PLL bandwidth. The maximum phase error overshoot resulting from insertion of the digital phase offset is determined for use in determining PLL peaking.

19 Claims, 10 Drawing Sheets

ON-CHIP PHASE-LOCKED LOOP RESPONSE MEASUREMENT

BACKGROUND

Field of the Invention

This invention relates to phase-locked loops (PLLs) and more particularly to measuring PLL response characteristics.

Description of the Related Art

The PLL closed loop transfer function is often measured on a tester using a sinusoidal signal generator to modulate the reference clock signal and a spectrum analyzer/oscilloscope to measure the PLL response by sending the PLL output clock signal off-chip to the test equipment. Such an approach to measuring PLL characteristics is time consuming requiring many seconds and even minutes to complete the testing and uses a complicated external test setup. The external measurement circuit often influences the test results and cause the test results to deviate from the actual PLL closed loop transfer function. Accordingly, improved techniques to measure PLL characteristics would be desirable.

SUMMARY OF EMBODIMENTS OF THE INVENTION

In an embodiment, a method for determining response of a phase-locked loop (PLL) includes inserting a digital phase offset into a digital representation of a clock signal coupled to a phase and frequency detector (PFD) of the PLL, the digital phase offset representing a phase step. The method further includes determining a length of time between insertion of the digital phase offset and a first zero crossing of a phase error supplied from the PFD after insertion of the digital phase offset, the length of time being inversely related to bandwidth of the PLL. The method may further include determining a maximum phase error overshoot resulting from insertion of the digital phase offset and determining a peaking characteristic of the PLL based in part on the maximum phase error overshoot.

In another embodiment an integrated circuit includes a time to digital converter to generate a digital representation of a clock signal. A summing circuit adds a digital phase offset to the digital representation of the clock signal, the digital phase offset representing a phase step. A counter counts a time period beginning when the digital phase offset is inserted. A first zero crossing detection circuit detects a first zero crossing of a phase error between the clock signal and a second clock signal after insertion of the digital phase offset and supplies a zero crossing indication. A count value of the counter is stored responsive to assertion of the zero crossing indication.

In another embodiment, an integrated circuit includes a summing circuit to add a digital phase offset to a digital representation of a first clock signal, the digital phase offset corresponding a phase step in the first clock signal. A phase and frequency detector of a phase-locked loop (PLL) receives the digital representation of the first clock signal and a digital representation of a second clock signal and supplies a phase error signal indicative of a difference between the first clock signal and the second clock signal. A first zero crossing detection circuit receives the phase error and detects a first zero crossing of the phase error after insertion of the phase offset. A counter determines an elapsed time between insertion of the phase offset and the first zero crossing. A maximum phase error circuit receives the phase error signal and detects a maximum phase error overshoot resulting from insertion of the digital phase offset.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Measuring PLL response on-chip provides faster and more accurate measurement of PLL characteristics as compared to traditional approaches using off-chip test equipment. PLL response measurement includes measuring PLL bandwidth and PLL peaking. In addition, on-chip measurement provides more versatility in terms of being able to measure PLL response in a production environment, in a lab or debug environment, and even in the field.

Figure 1:
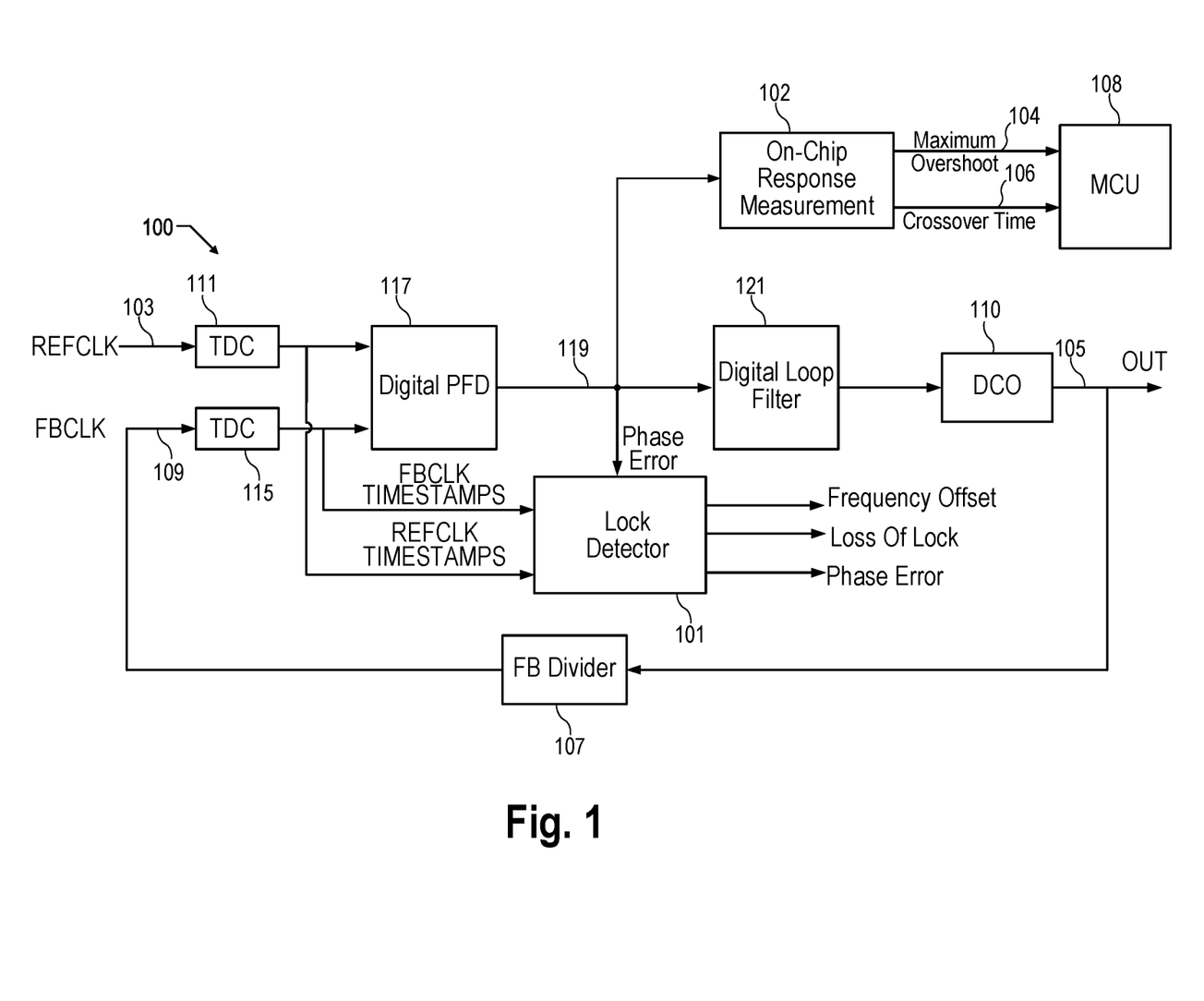
FIG. 1 illustrates a high level block diagram of a system that includes on-chip PLL response measurement capability.

FIG. 1 illustrates a high level block diagram of a system that includes a phase-locked loop (PLL) 100 and a lock detector 101. The PLL 100 includes an on-chip response measurement circuit 102 that receives the phase error 119 and supplies a maximum overshoot indication 104 and zero crossover time 106, which can be used to determine the PLL response in terms of peaking and bandwidth as explained further herein. In an embodiment, portions of the lock detector can be advantageously used in determining the PLL response on-chip.

The PLL 100 receives a reference clock signal 103, which can be supplied, e.g., from a crystal oscillator, a microelectromechanical structure (MEMS) oscillator, or other suitable low-jitter clock source. The digitally controlled oscillator (DCO) 110 supplies an output clock signal 105. A feedback divider 107 receives the output clock signal 105 and supplies a feedback clock signal 109. Time to digital converters (TDCs) 111 and 115 convert the reference clock signal 103 and the feedback clock signal 109 to digital representations of the clock signals, which are supplied, e.g., as time stamps (indicating the time a rising edge or falling edge (or both) occur) to a digital phase and frequency detector (PFD) 117. PFD 117 supplies a phase error 119 indicating the phase difference between the reference clock signal 103 and the feedback clock signal 109. A digital loop filter 121 and the lock detector 101 both receive the phase error from digital PFD 117.

Lock detector 101 also receives the time stamps from TDCs 111 and 115. In at least one embodiment TDC 111 and TDC 115 are implemented by corresponding counter circuits. The lock detector uses these time stamps to measure the frequency offset between the clocks and provide the frequency lock status. The lock detector utilizes both time resolution and frequency resolution in determining whether the system is in lock or out of lock.

In an embodiment, the lock detector 101 provides a loss of lock indicator when there is either a phase loss of lock or a frequency loss of lock. The lock detector tracks the phase error information from the digital PFD 117 to determine if the PLL is phase locked. The frequency loss of lock indicates that the frequency offset between the reference clock signal 103 and the feedback signal 109 is larger than a frequency offset threshold. The phase loss of lock indicates whether the phase error is larger than a phase error threshold. In addition, the lock detector 101 provides a quantitative value of the frequency offset and the phase error. Most existing techniques provide either phase or frequency lock monitoring but not both. In addition, existing techniques do not address the stochastic behaviors of the reference clock and how to provide a faster unlock detection during those transient events and avoid any chattering of lock status for steady state operation.

Figure 2:
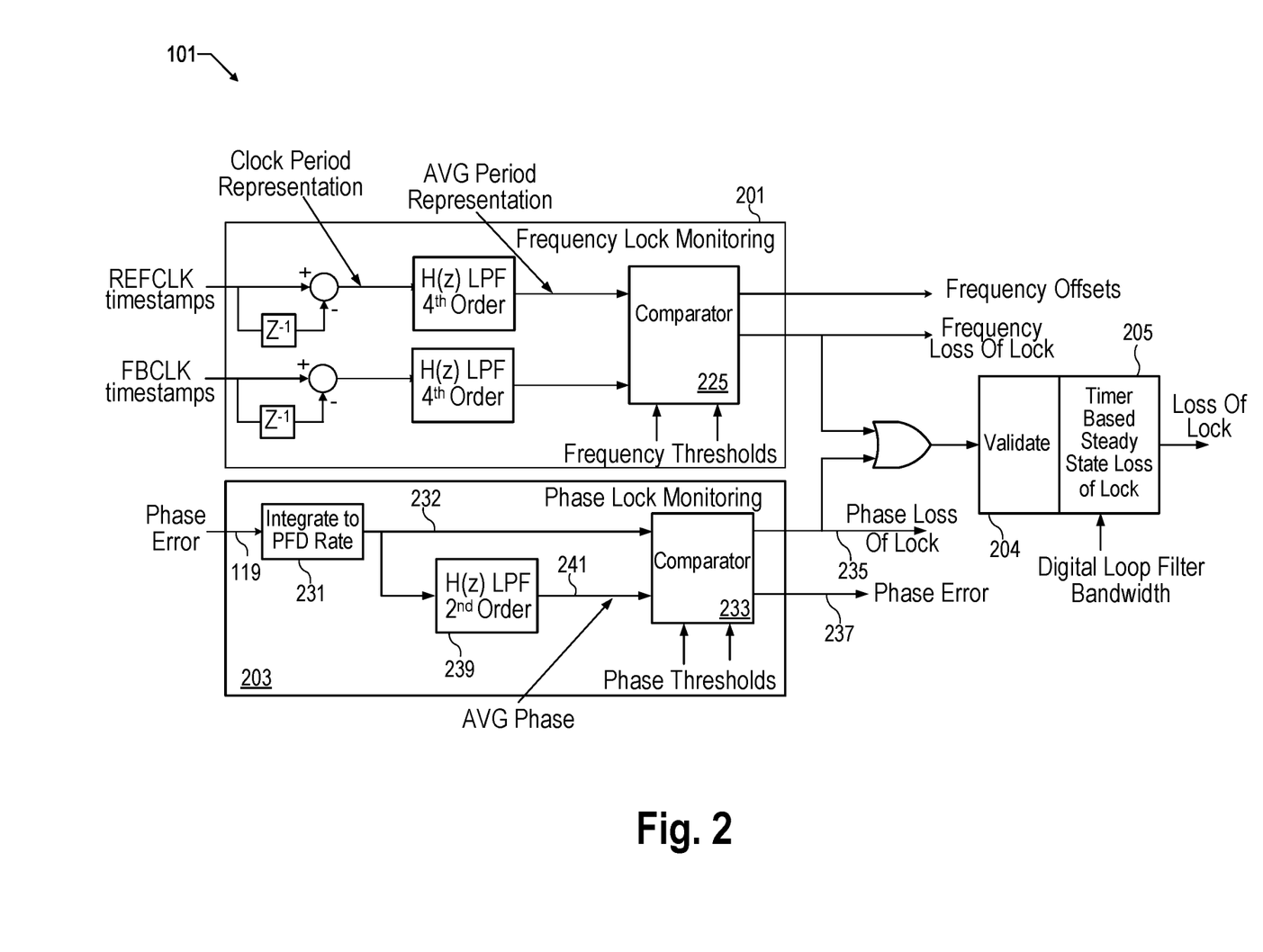
FIG. 2 illustrates a functional block diagram of a lock detector circuit that includes a frequency lock monitoring circuit and a phase lock monitoring circuit.

FIG. 2 illustrates a block diagram of the lock detector 101. Lock detector 101 includes a frequency lock monitoring circuit 201, phase lock monitoring circuit 203, and a validate circuit 204 and timer-based loss of lock clearing circuit 205 that tracks the loop filter bandwidth settings. Additional details of the frequency lock monitoring circuit 201, the validate circuit 204, and the timer-based loss of lock clearing circuit 205 can be found in the application entitled "Accurate and Reliable Digital PLL Lock Indicator", naming Kannanthodath V. Jayakumar et al. as inventors, application Ser. No. 16/580,161, filed Sep. 24, 2019, which application is incorporated herein by reference in its entirety.

The phase lock monitoring circuit 203 can be used advantageously to implement part of the on-chip PLL response measurement circuit 102 (see FIG. 1). The phase error/time error of a clock is the difference between the time indicated by the clock under test and a reference clock which can be denoted as phase error (t)=$T_{fb}(t)-T_{ref}(t)$, where $T_{fb}$ is the time of the feedback clock provided as a time stamp and $T_{ref}$ is the time of the reference clock provided as a time stamp. In an embodiment the phase lock monitoring circuit receives phase errors 119 that are oversampled in the digital PFD 117 (see FIG. 1). Integrator 231 integrates the samples to a rate corresponding to a non-oversampled PFD rate and supplies the integrated phase error 232.

Comparator 233 receives the integrated phase error 232 and compares the phase error 232 to a threshold phase error value and supplies a phase loss of lock indicator 235 indicative of the comparison along with the phase error amount 237. In addition, in embodiments, a low pass filter 239 receives the phase error 232 and supplies an average phase error 241. While FIG. 2 shows filter 239 as a second order filter, in other embodiment a higher order filter may be used to get better filtering of the noise present in the phase error information and hence more accurate detection of phase lock status. The choice of filter depends on system requirements. The comparator circuit 233 compares the average phase error 241 to a threshold average phase error value to determine a loss of lock condition. Comparisons of either or both of the average phase error 241 and the phase error 232 to respective thresholds may be used to determine when to assert the phase loss of lock signal 235. As explained further herein, those thresholds can also be used to determine a zero crossing of the phase error and thus the crossover time as part of determining PLL bandwidth.

Figure 3:
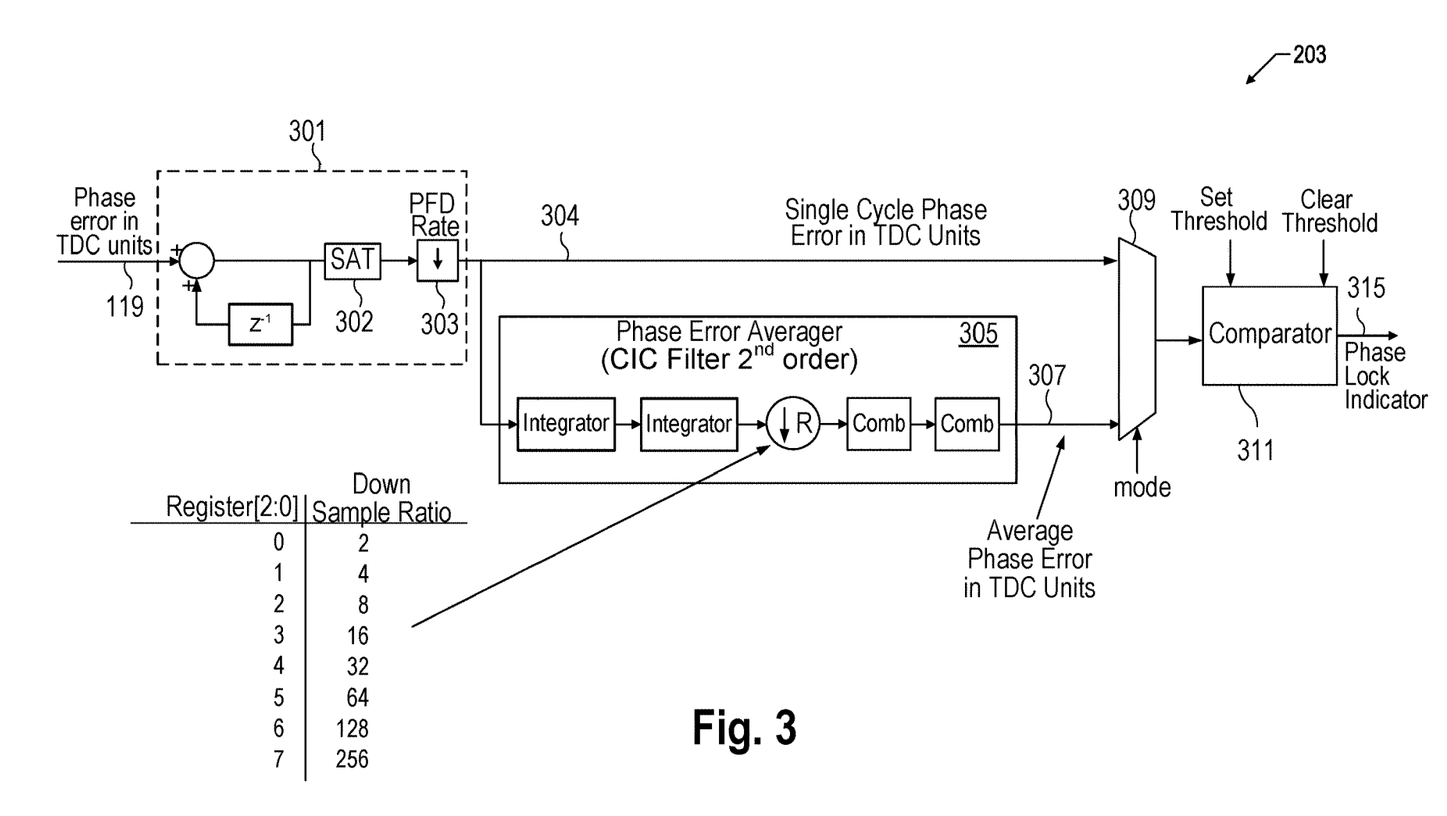
FIG. 3 illustrates a functional block diagram of an embodiment of a phase lock monitoring circuit.

FIG. 3 illustrates additional details of an embodiment of the phase monitoring circuit 203. The phase monitoring circuit uses phase error information from the digital PFD circuit to detect whether the error is within the phase error threshold to determine if the PLL is phase locked. The phase error 119 provided by the digital PFD is at an interpolated PFD rate. In an embodiment, the phase error information provided by the PFD is at N×PFD frequency, where N is the interpolation factor. The phase error that the PFD measures is distributed in smaller portions at higher speed to the lock detection circuit. The PFD sends the phase error in this way due to interface requirements with the loop filter. The phase error circuit 203 utilizes an integrate and dump circuit 301 to integrate the phase error 119 from the digital PFD and determine if the phase error between the feedback and reference clocks is within or has exceeded the phase lock threshold. The integrated and dump circuit accumulates samples over a chosen measurement time frame (N samples) and then "dumps" the resulting value. The saturation block 302 ensures the value of the PFD error does not exceed the limit and roll over from, e.g., a high value to a low value. As discussed earlier, the PFD provides the phase error information at N×PFD frequency. The integrator accumulates the phase error for N samples. The down sampler 303 dumps the integrated phase error at the PFD frequency, which is at the down sampled rate compared to the input rate. That allows the phase lock monitoring circuit 203 to assert a loss of phase lock for single event transients of the reference or feedback clock that cause a phase error larger than the phase error threshold. In order to deal with the stochastic nature of the input clock, the phase error detect circuit can be used for fast loss of lock triggering. However, the reference clock signal includes noise due to, e.g., jitter and wander and the feedback clock signal can also include noise and the threshold settings should accommodate an appropriate margin for such noise so as to not trigger too often due to transient events.

In one or more embodiments, the phase monitor circuit 203 also provides average phase error information. A phase error average circuit 305 uses the information from the integrate and dump circuit and passes it through a second order CIC filter. This filter has a programmable averaging window length (by adjusting the down sample ratio as desired) to adjust the window length. The CIC filter removes high frequency noise. As averaging is increased the phase error will approach DC (static) phase error information, which can be considered as the true phase lock condition. In an embodiment, a selector circuit 309 selects between the single cycle phase error 304 or the average phase error 307 and supplies the selected phase error to comparator 311. The comparator 311 supplies the phase lock indicator 315 after comparing the selected phase error to programmable thresholds to see if the phase error is greater than a set threshold causing the phase lock indicator to be asserted to indicate an out of lock condition or deasserted if the phase error is below a threshold to indicate a lock condition. The programmability of the thresholds allows the comparator to be used to help determine the zero crossings as described further herein.

PLL loop response is specified by the closed loop transfer function of phase modulation. The PLL behaves as a low pass filter of reference modulation since its output follows its reference at low modulation frequency and cannot track high modulation frequencies. In particular: $\theta_{in}(t)=2\pi f_{ref} t + A_{in} \sin(2\pi f_m t)$, where $\theta_{in}(t)$ is the phase of the reference clock signal, $f_{ref}$ is the frequency of the reference clock, and $f_m$ is the reference clock modulation frequency. $\theta_{out}(t, f_m) = N (2\pi f_{ref} t) + A_{out}(f_m) \sin(2\pi f_m t + \theta_m(f_m))$, where $\theta_{out}(t, f_m)$ is the phase of the DCO output signal, N is the feedback divisor, $A_{out}(f_m)$ and $\theta_m(f_m)$ are the magnitude and phase response functions of the reference clock modulation.

The resulting magnitude response of the PLL transfer function is therefore $$H(f_m) = \frac{1}{N} \frac{A_{out}(f_m)}{A_{in}},$$

which is the normalized feedback divisor to account for the frequency and phase multiplying action of the PLL.

The PLL response is summarized by its bandwidth and peaking characteristics. The PLL bandwidth measured at the −3 dB point is chosen by balancing the effects of reference input noise and internally generated PLL noise to achieve the lowest PLL output clock jitter. Lower bandwidth attenuates more noise in the reference clock input at the expense of rejecting less noise generated by PLL circuitry while higher bandwidth achieves the opposite. Maximum value in the transfer function is referred to as the gain peaking. Higher peaking is undesirable from a jitter perspective since a PLL amplifies the phase modulation at the peaking frequency.

Figure 4:
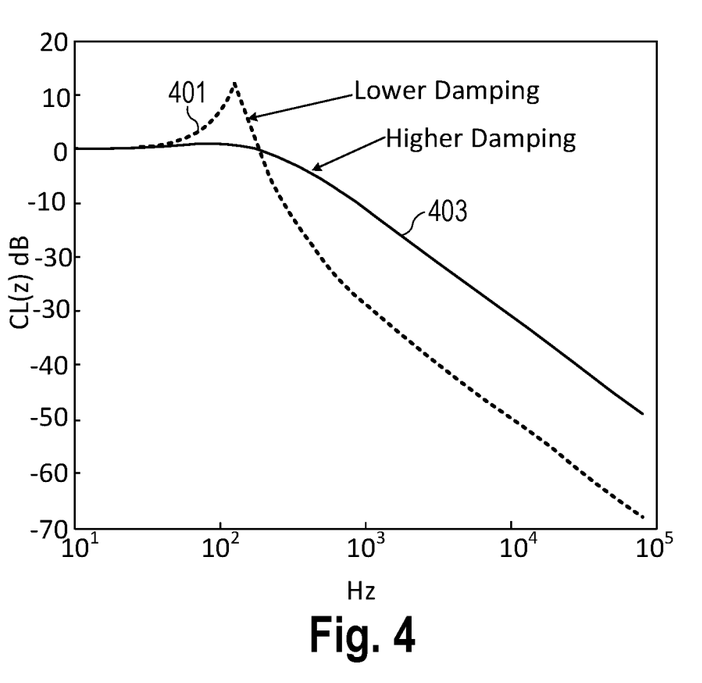
FIG. 4 illustrates PLL jitter transfer with different PLL bandwidths and peaking.

FIG. 4 illustrates PLL jitter transfer functions with different bandwidths and different peaking. CL(z) is the closed loop magnitude in dB and the x-axis is the normalized frequency of the reference clock in Hz. Transfer function 401 shows larger peaking (lower damping) and lower bandwidth relative to transfer function 403, which shows less peaking (higher damping) and a wider bandwidth. FIG. 4 illustrates that different PLL configurations can provide different bandwidth and different peaking characteristics for identical reference clock and output frequencies. FIG. 4 shows the PLL transfer response has a low pass characteristic for the input clock phase modulation. The on-chip response measurement circuit can determine if actual results on-chip match the expected results such as those shown in FIG. 4.

Figure 5A:
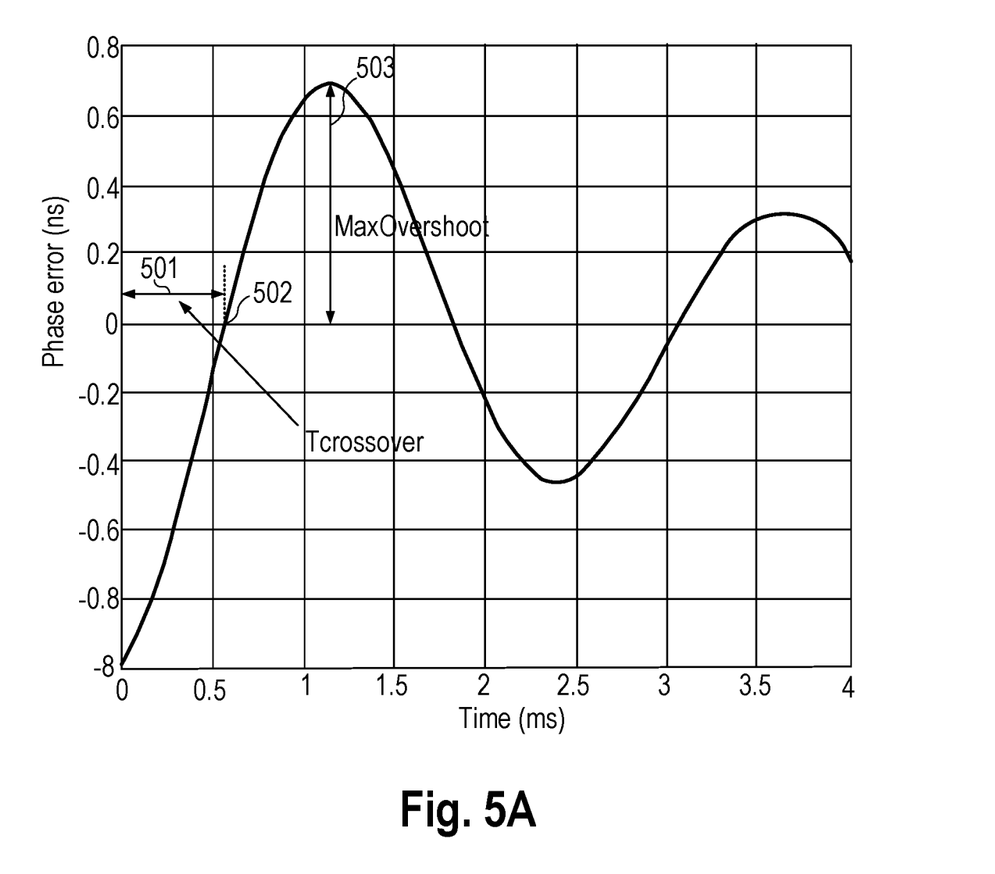
FIG. 5A illustrates PLL phase error response to a phase step.
Figure 5B:
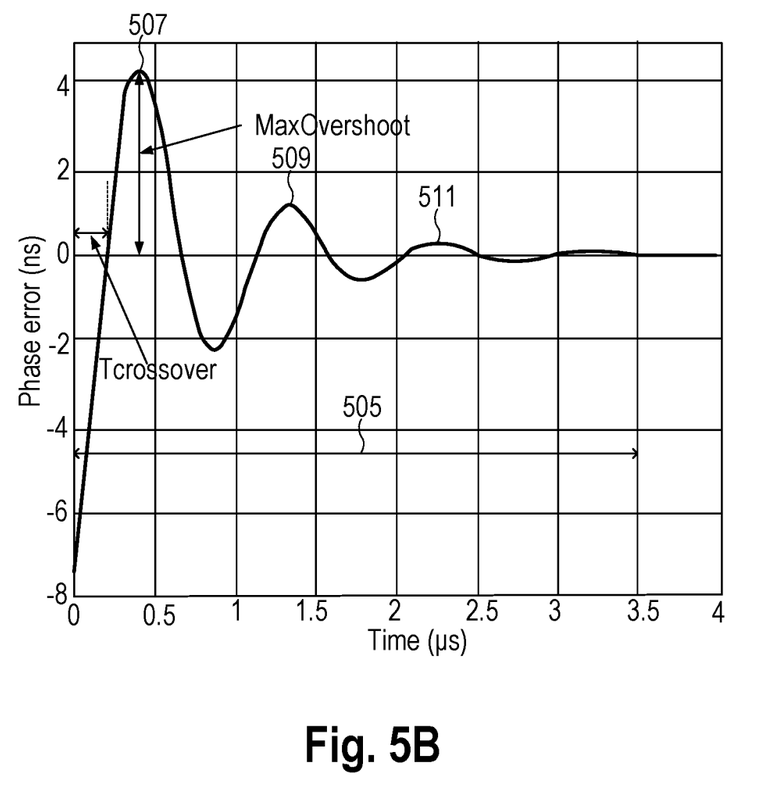
FIG. 5B illustrates PLL phase error response to a phase step showing the phase error ringing settling to a steady state.

FIG. 5A shows a typical PLL transient response to an induced input phase step at time 0. The phase step is being provided in accordance with embodiments described herein. The PLL tends to overcorrect (or overshoot) as it tries to eliminate the added phase step. In FIG. 5, the PLL simulation model was configured to be underdamped and as a result exhibits more ringing to show the ringing effects more clearly. A key metric in the PLL step response is $T_{crossover}$ 501 defined as the elapsed time from when the input step is applied to the onset of the initial phase overshoot at the zero crossing 502. Another key metric shown here is the maximum overshoot 503, which indicates the maximum overcorrection to the applied phase step. FIG. 5B shows another example of PLL response to a phase step showing that after the phase step, the system eventually eliminates the added phase step.

Figures 6A, 6B:
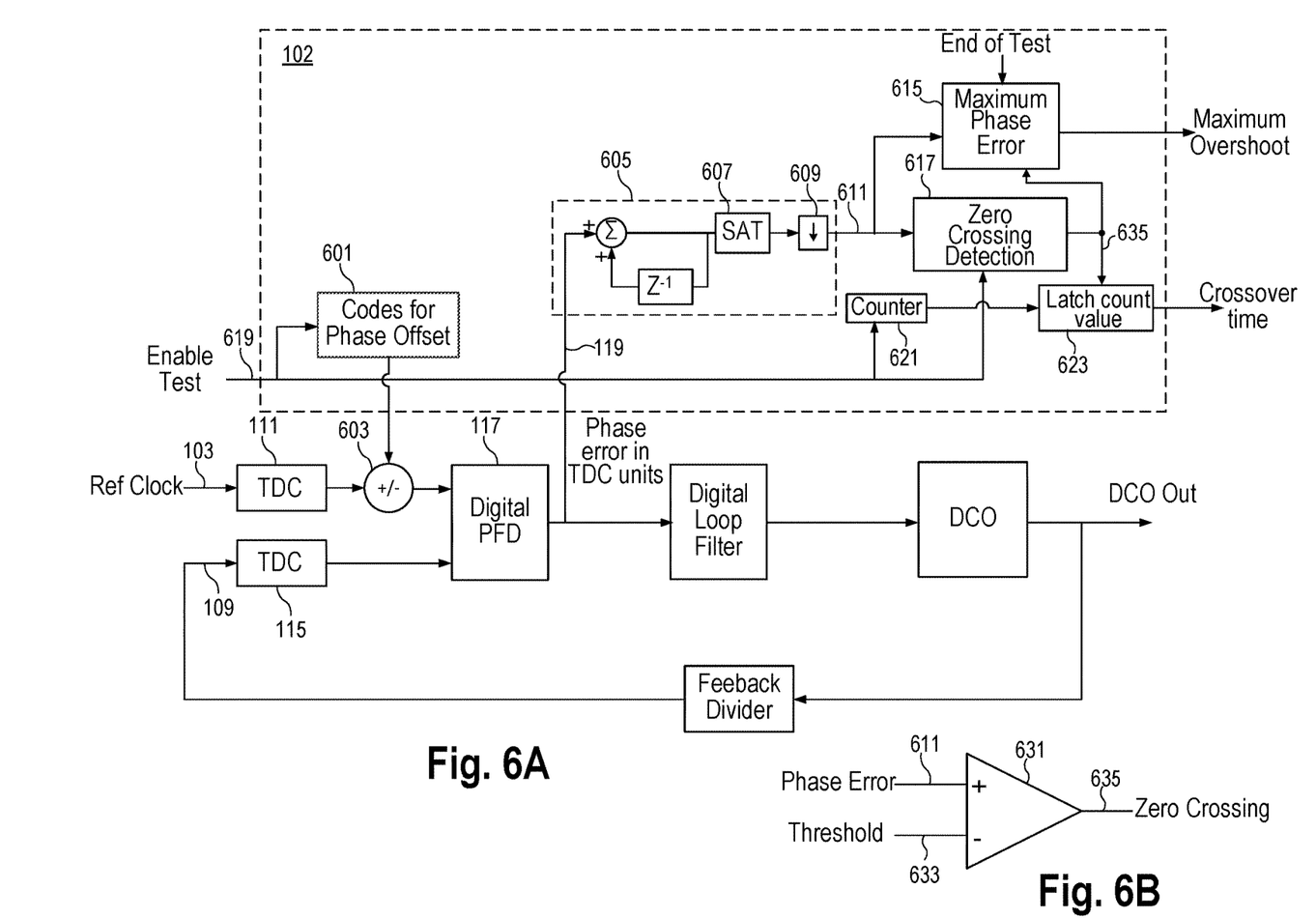
FIG. 6A illustrates a functional block diagram of an embodiment of an on-chip PLL response measurement circuit.
FIG. 6B shows a comparator used as a zero crossing detector.

FIG. 6A shows additional details of the on-chip circuit to measure PLL response. Embodiments may also include the lock detector 101 shown in FIG. 1. The on-chip response measurement circuit performs time-domain measurements of PLL output phase in response to an induced phase step. These measurements are correlated to bandwidth and peaking in the frequency domain. The phase of the reference clock is instantaneously advanced (phase step) and the resultant phase error transient is recorded. In order to insert the phase step, a digital phase offset is stored in storage 601 and the digital phase offset, which can be a positive or negative offset, is supplied to a summer 603. Note that rather inserting the phase step in the digital representation of the reference clock signal, other embodiments insert the phase offset into the digital representation of the feedback clock signal. Once the offset is inserted, the summer 603 is bypassed for the remainder of the test using switches or an offset code of zero is supplied to the summing circuit 603. PFD 117 supplies digital phase error information 119 to the integrate and dump circuit 605. As explained in relation to FIG. 3, the integrate and dump circuit 605 integrates the phase error 119 from the digital PFD 117. The integrated and dump circuit 605 accumulates samples over a chosen measurement time frame (N samples) and then "dumps" the resulting value. The saturation block 607 ensures the value of the PFD error does not exceed the limit and roll over from, e.g., a high value to a low value. As discussed earlier the PFD provides the phase error information at N×PFD frequency. The integrator accumulates the phase error for N samples. The down sampler 609 dumps the integrated phase error at the down sampled rate. In other embodiments, the integrated and dump circuit 301 shown in FIG. 3 may be used during the PLL response testing. In still other embodiments, depending on the particular PFD configuration and sampling approach (e.g., the PFD supplies the phase error at the PFD frequency not an interpolated rate), the integrate and dump circuit 605 can be omitted. The maximum phase error circuit 615 and the zero crossing detection circuit 617 receive the phase error 611 supplied by integrate and dump circuit 605. A test enable signal 619 starts the PLL response testing. On assertion of the test enable signal 619, the phase offset is inserted into the reference clock digital representation (or the feedback clock signal). Concurrent with insertion of the phase step, counter 621 begins counting. With reference to FIG. 5A, the zero crossing detector is looking for the phase error to go to zero at 502 the first time after insertion of the phase step. In an embodiment a comparator 631 shown in FIG. 6B implements this function by setting a compare threshold 633 to a value corresponding to zero to compare to the phase error. The phase error going above that threshold value for the first time indicates the first zero crossing 635. Detecting the zero crossing causes the count value of counter 621 to be stored in storage 623 (or is stored by stopping counter 621) and that count value is used to determine PLL bandwidth.

The maximum phase error logic circuit 615 determines the maximum overshoot by comparing the current phase error to a current maximum phase error being stored and replaces the current maximum if the current phase error is greater than the current maximum. The maximum phase error logic begins to monitor the current phase error after the zero crossing event has occurred. The maximum phase error logic stops monitoring the phase error at the end of the measurement cycle (end of test) once a steady state lock has been achieved indicating the phase error has settled and converged to near zero after inducing the phase step for the measurement or after a predetermined time period after the zero crossing or a predetermined time period after enable test 619 is asserted. For example, the average phase error 307 (see FIG. 3) may be used to determine end of the test. The maximum phase error is the maximum overshoot used to determine PLL peaking.

The maximum overshoot and zero crossover time can be used to determine the PLL response based on the relation of the zero crossover time to the reciprocal of bandwidth and based on the relation of maximum phase error overshoot to PLL peaking. Dedicated circuits can be used to determine the PLL response, or a central processing unit (CPU) in a microcontroller unit (MCU) or other processor on the integrated circuit can be used to process the maximum overshoot and crossover time data to characterize the PLL response.

Bandwidth of a second order type 2 PLL can be defined as shown below in equation (1) where $\omega_{3db}$ is the 3-dB bandwidth and $\omega_n$ is the natural frequency of the PLL and $\zeta$ is the damping factor.

$$\theta_{3db} = \omega_n(2\zeta^2 + 1 + \sqrt{((2\zeta^2+1)^2+1)})^{1/2} \quad (1)$$

For a PLL with a defined damping factor and natural frequency we have a theoretical 3-dB loop bandwidth. The natural frequency of the PLL $\omega_n$ is inversely related to PLL time constant loop filter $$\left(\omega_n \propto \frac{1}{\sqrt{\tau}}\right).$$

Figure 7:
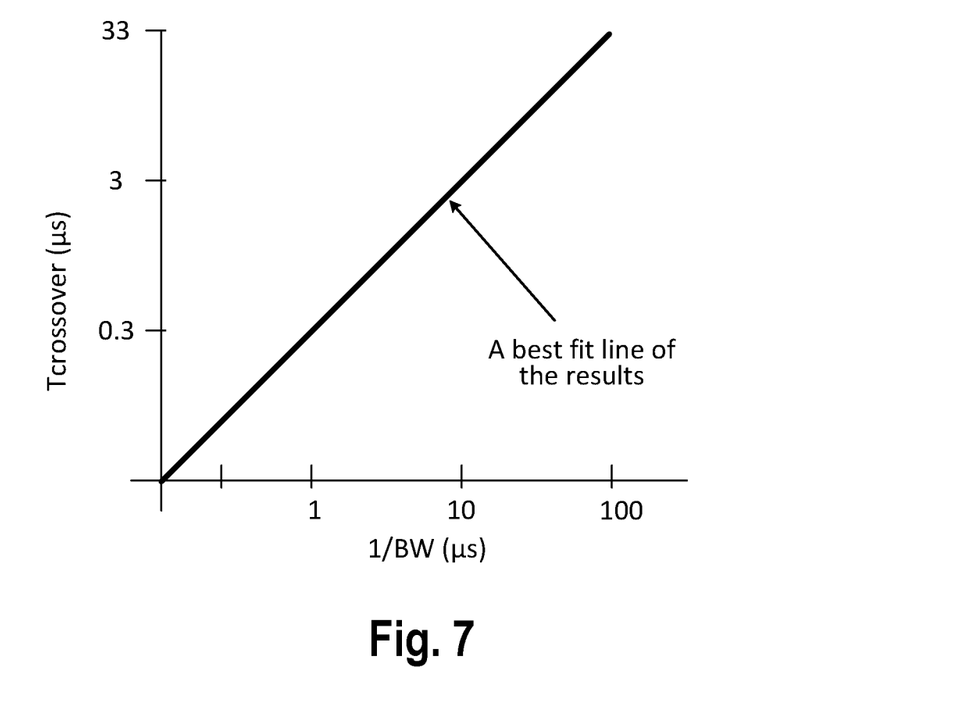
FIG. 7 illustrates a graph of crossover time versus inverse of closed loop 3 dB bandwidth.

Thus, the length of time to crossover ($T_{crossover}$) during an induced phase step is inversely related to the bandwidth of the PLL. Referring to FIG. 7, the crossover time ($T_{crossover}$) is shown to be linearly proportional to the reciprocal of the PLL's 3-dB closed loop bandwidth as shown in the simulation results shown in FIG. 7. FIG. 7 shows that the lower the bandwidth, the higher the $T_{crossover}$. Note that $T_{crossover}$ is not very sensitive to the magnitude of the phase step. FIG. 7 illustrates that the crossover time is directly proportional to the inverse of band width provided all the other PLL parameters are held constant. For example, the slope of the graph changes when the damping factor is different. In one example, the crossover time is approximately equal to 2.5/BW for a damping factor of 1.

Figure 8:
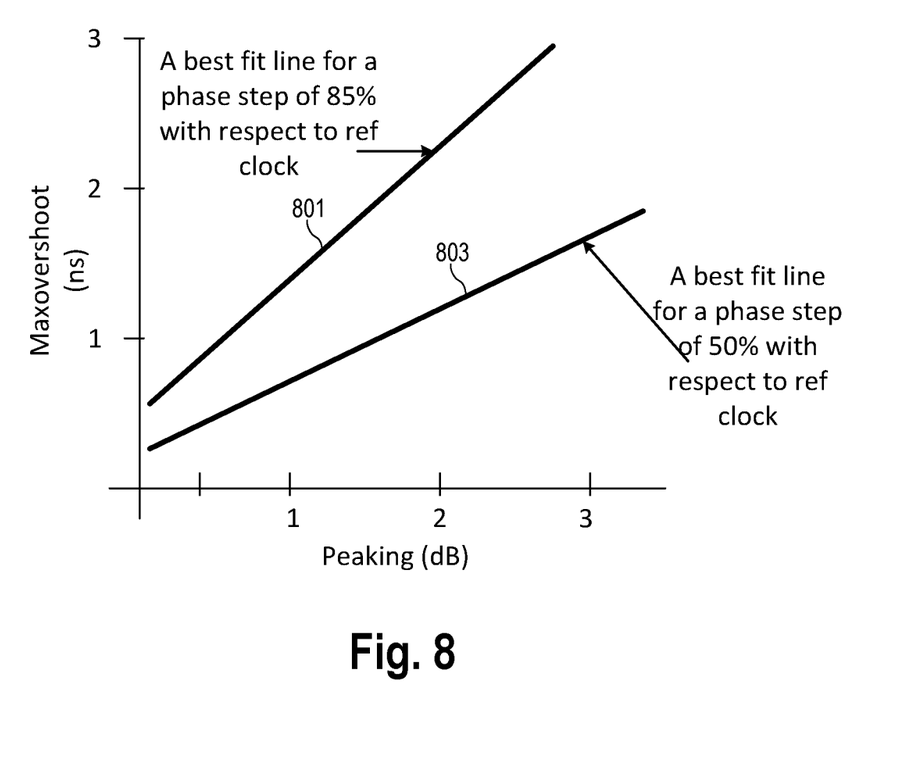
FIG. 8 illustrates a graph of maximum phase error overshoot versus closed loop peaking.

Simulations and loop equations also predict maximum overshoot is proportional to the maximum peaking in the closed loop transfer function. In particular, the larger the overshoot, the greater the peaking. The magnitude of the overshoot is also proportional to the magnitude of the phase step. Maximum overshoot or peak output value during an induced phase step can be defined approximately as shown below.

$$\text{Max overshoot} = \quad (2)$$
$$phase_{step} * \left(1 + \exp\left(\frac{-\zeta}{\sqrt{1-\zeta^2}}\right) * T_p * \left(\cos T_p - \frac{\zeta}{\sqrt{1-\zeta^2}}\sin T_p\right)\right)$$

where $T_p = \omega_n\sqrt{1-\zeta^2}$. Here the $phase_{step}$ is the induced phase step to the PLL, $\omega_n$ is the natural frequency of the PLL and $\zeta$ is the damping factor. FIG. 8 shows simulation results of the response for phase steps of two different magnitudes and shows the directly proportional relationship between the maximum phase overshoot to the PLL closed loop jitter peaking with the set of other PLL parameters kept constant in simulation. The response 801 is the best fit line for a first phase step of 85% with respect to the reference clock, i.e., 85% of the period of the reference clock. The response 803 illustrates the best fit line for a phase step of 50% with respect to the reference clock.

Although FIG. 6A shows a separate on-chip response measurement circuit 102, in embodiments, on-chip capabilities described in FIGS. 1, 2, and 3 can be used in the PLL response testing. The input reference clock is transferred into a time code representation by the Time to Digital converter (TDC). The time codes from the TDC are passed through an adder/subtractor circuit 603 (see FIG. 6A) before it reaches the digital PFD and lock detector circuit 101 (see FIG. 1). The test is initiated by asserting the test enable signal 619 shown in FIG. 6A, which in turn activates the required circuits needed to measure the PLL transient responses for an induced phase step.

Assertion of the test enable signal 619 enables a timecode value to be added to or subtracted from the actual time code from the TDC that represents the reference clock, thereby creating a phase step when seen from digital PFD 117 and lock detector 101. The induced phase step is seen by the PFD as phase error between reference and feedback clocks and the PLL responds to the phase step based on its characteristics. The response of the PLL is continuously monitored and captured by the lock detector. The phase error information is processed by the phase lock monitoring circuit 203 (see FIG. 3) and the phase lock monitoring circuit 203 supplies information used to determine the bandwidth and maximum overshoot produced by the PLL under test.

The phase lock phase lock monitoring circuit 203 has programmable thresholds to determine if the phase error in the PLL loop is greater or lower than the limits. That is achieved in one embodiment by setting a trigger threshold to determine if the phase error introduced in the loop is greater than the set limit (out of lock) and a clear threshold that causes the lock indication to assert if the phase error is below the clear threshold. The circuit has an internal counter (not shown in FIG. 3) that starts counting in response to a phase error greater than a trigger threshold (in response to phase loss of lock) and stops counting when the phase error is less than the clear threshold indicating the phase is locked. Thus, those thresholds can be used by setting the trigger threshold at just below the phase step and setting the clear threshold close to zero. In that the way the internal counter in the phase lock monitoring circuit can be used to start counting on application of the phase step and stop counting when the phase error crosses zero. In an embodiment, the counter runs on an internally calibrated oscillator which allows conversion of the count value to time representation. Of course, other embodiments may use dedicated circuits for the on-chip response measurement circuit or a different combination of available circuits and dedicated circuits.

Figure 9:
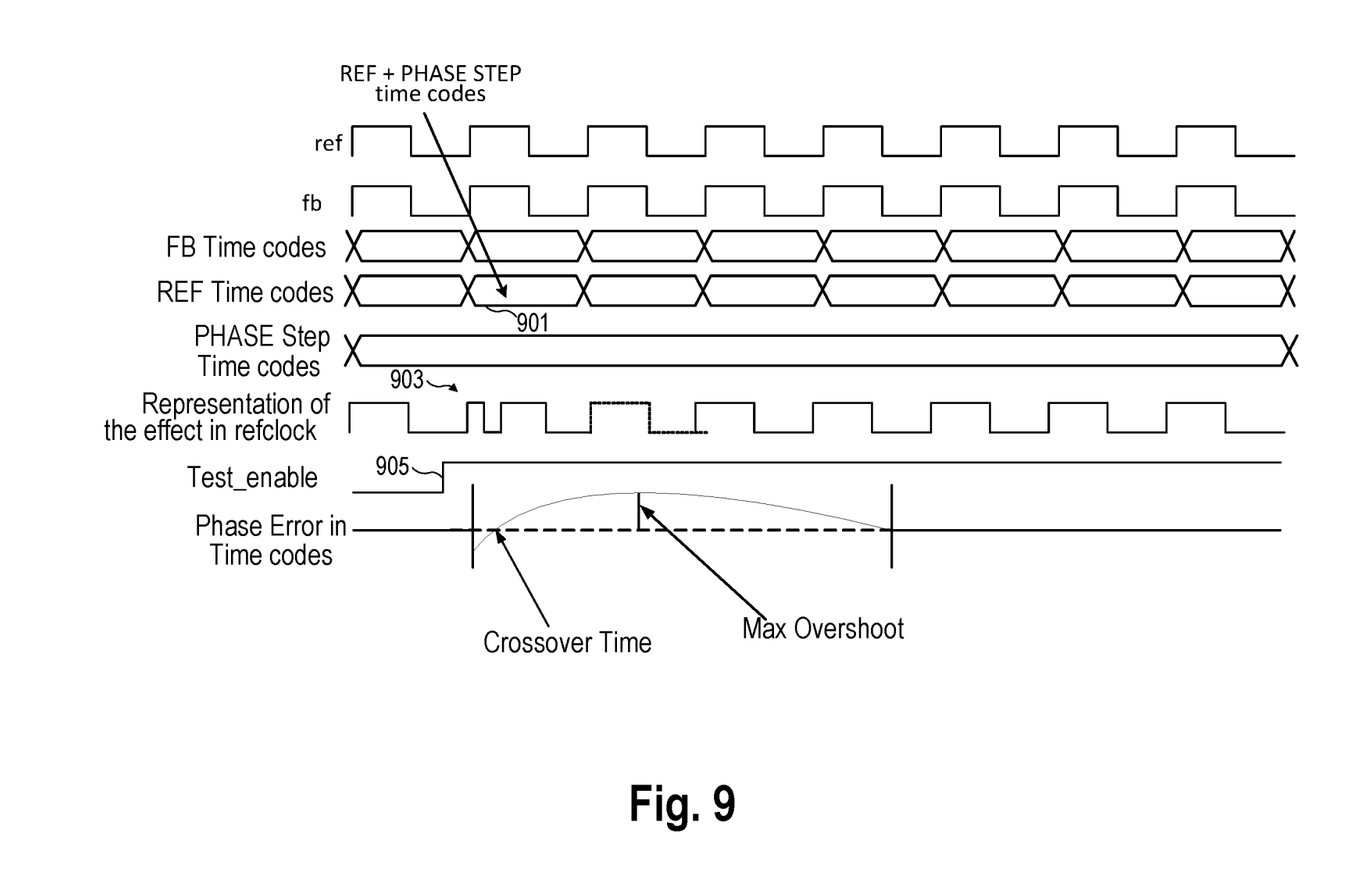
FIG. 9 is a timing diagram showing PLL response testing using an applied phase step.

FIG. 9 shows the timing diagram illustrating the PLL response test operation. FIG. 9 shows the reference clock (ref) and feedback clock (fb) with their associated time stamp information in time codes. The phase step time code is also shown. The phase step time code is summed into the reference time code once at 901. That introduces a phase step into the loop and the PLL operates to eliminate the introduced phase error. FIG. 9 also shows the effect at 903 on the reference clock as well as the assertion of the test enable signal at 905. Finally, FIG. 9 illustrates the phase error in time codes. Note that the shape of the phase error shown in FIG. 9 may look like the phase error shown in FIGS. 5A and 5B but depends on the damping factor of the PLL.

The processed phase error information from the lock detector or dedicated circuits can be streamed out continuously to an internal MCU memory for post processing by an MCU or other on-board processor to determine the zero crossover time and the maximum overshoot rather than using dedicated circuitry to determine the maximum overshoot and zero crossover time in real time. Additionally, the programmed processor can determine the bandwidth from the zero crossover time and PLL peaking from the maximum overshoot. That data can be provided like other diagnostic or error data off-chip through a serial port or other reporting path. Additional characterization of the PLL can also be determined for the PLL under test such as settling time (see settling time 505 in FIG. 5B), peak undershoot (maximum negative phase error after the first zero crossing), and the time difference between consecutive peaks (e.g., 507, 509, and 511 in FIG. 5B) of the transient response. That information can be used to determine the damping factor of the PLL, natural frequency of the PLL, and settling time for the PLL. Dedicated circuitry can be used or an on-board programmed processor can be used to determine various characteristics of the PLL described herein.

Figure 10:
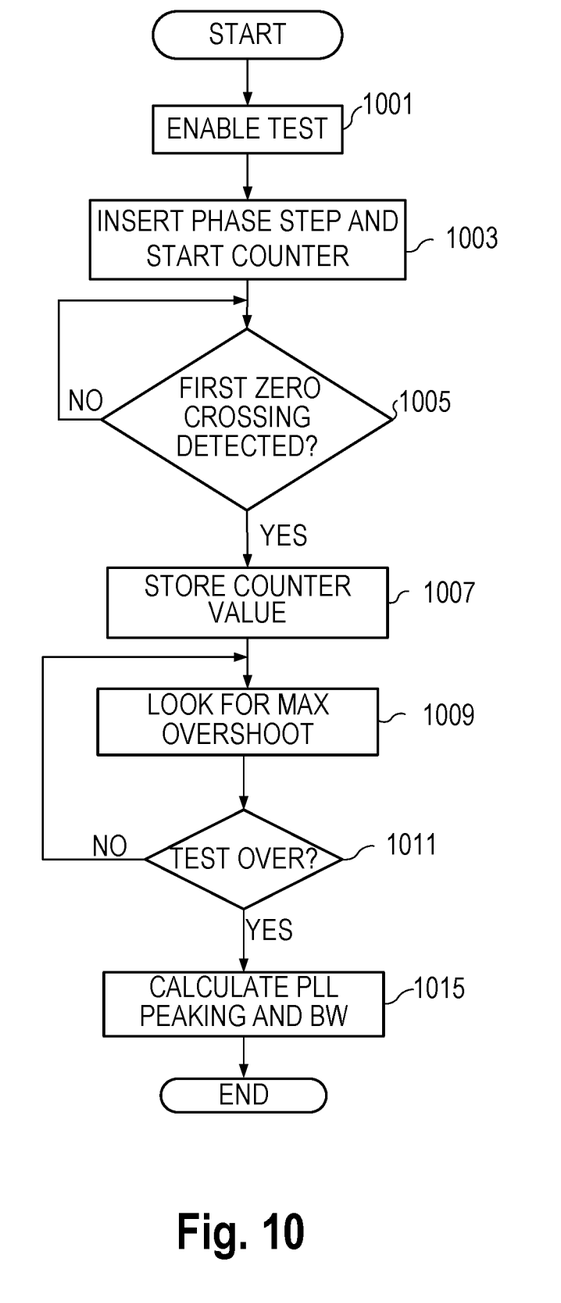
FIG. 10 is a flow chart showing a high level control flow for determining PLL response.

FIG. 10 illustrates a high level flow chart for on-chip measurement of the PLL response. At 1001 the PLL test is enabled resulting in the phase step being inserted and the counter for the zero crossing detector beginning its count. The zero crossing detector evaluates the phase information and looks for the phase error zero crossover in 1003. The zero crossing may be detected, e.g., using the comparator to determine the first zero crossing. The test waits for the phase error to be zero in 1003 and on detection of the zero crossing, in 1005 stores the counter value at the zero crossing. Detection of the zero crossover causes the maximum error detector to begin looking for the maximum phase error. In 1007 the logic looks to see if a current phase error is larger than the current maximum and if so, replaces the current maximum. In 1009 the maximum phase error logic checks if the test is over based on, e.g., a predetermined number of phase errors being less than a threshold (or average phase error being less than a threshold), a predetermined time period has expired, or some other indicator that the maximum phase error has already been detected. If the test is over the maximum phase error is the maximum overshoot and is available to determine PLL peaking and the zero crossover time is available to calculate the bandwidth. In embodiments, an on-board microcontroller 108 (see FIG. 1) is programmed to calculate the bandwidth based on the linear relationship shown, e.g., in FIG. 7. In addition, the on-board microcontroller can calculate PLL peaking based on the relationships shown in FIG. 8 or another curve suitable for the particular size of the phase step. In addition to characterizing the PLL based on bandwidth and peaking, if the phase error is stored, or if additional dedicated circuitry is provided, the settling time, peak undershoot, and the time difference between consecutive peaks of the transient response can be used to further characterize the PLL. That information can be used to determine the damping factor of the PLL, natural frequency of the PLL, and settling time for the PLL. In embodiments, if an on-board processor is not available, the zero crossover time and the maximum phase error overshoot is provided off-chip for additional processing.

Thus, techniques have been described for determining PLL response using on-chip circuitry. The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. A method for determining response of a phase-locked loop (PLL), comprising:
   inserting a digital phase offset into a digital representation of a clock signal coupled to a phase and frequency detector (PFD) of the PLL, the digital phase offset representing a phase step;
   determining a length of time between insertion of the digital phase offset and a first zero crossing of a phase error supplied from the PFD after insertion of the digital phase offset, the length of time being inversely related to bandwidth of the PLL; and
   determining a maximum phase error overshoot that occurs after the zero crossing and results from insertion of the digital phase offset.

2. The method as recited in claim 1, further comprising:
   determining a peaking characteristic of the PLL based in part on the maximum phase error overshoot.

3. The method as recited in claim 1, further comprising:
   evaluating phase errors for the maximum phase error overshoot responsive to assertion of the zero crossing indication.

4. The method as recited in claim 1, wherein determining the length of time comprises:
   enabling a counter coincident with the digital phase offset being inserted;
   detecting a first zero crossing of a phase error after insertion of the digital phase offset; and
   determining a count value of the counter at a time of the first zero crossing.

5. The method as recited in claim 4, further comprising:
   determining a PLL bandwidth based on the count value of the counter at the time of the first zero crossing.

6. The method as recited in claim 4, further comprising:
   asserting a test signal to cause the phase step to be inserted and the counter to start counting.

7. The method as recited in claim 1, further comprising:
   wherein the clock signal is a reference clock signal being supplied to the PLL.

8. The method as recited in claim 1, further comprising:
   wherein the clock signal is a feedback clock signal coupled to a feedback divider of the PLL.

9. An integrated circuit comprising:
   a time to digital converter to generate a digital representation of a clock signal;
   a summing circuit to add a digital phase offset to the digital representation of the clock signal, the digital phase offset representing a phase step;
   a counter to count a time period beginning when the digital phase offset is inserted;
   a first zero crossing detection circuit to detect a first zero crossing of a phase error between the clock signal and a second clock signal and supply a zero crossing indication, the first zero crossing occurring after insertion of the digital phase offset;
   wherein a count value of the counter is stored responsive to assertion of the zero crossing indication; and
   a maximum phase error circuit to detect a maximum phase error overshoot resulting from insertion of the digital phase offset.

10. The integrated circuit as recited in claim 9, wherein the maximum phase error circuit begins evaluating phase errors for the maximum phase error overshoot responsive to assertion of the zero crossing indication.

11. The integrated circuit as recited in claim 9, further comprising:
wherein a peaking characteristic of a phase-locked loop is determined based on the maximum phase error overshoot and a size of the phase step.

12. The integrated circuit as recited in claim 9, further comprising:
wherein a bandwidth of a phase-locked loop is determined based on the count value of the counter at the first zero crossing.

13. The integrated circuit as recited in claim 9, further comprising:
wherein the clock signal is a reference clock signal being supplied to a phase-locked loop and the second clock signal is a feedback clock signal supplied by a feedback divider of the phase-locked loop.

14. The integrated circuit as recited in claim 9, further comprising:
wherein the clock signal is a feedback clock signal coupled to a feedback divider of a phase-locked loop and the second clock signal is a reference clock signal.

15. The integrated circuit as recited in claim 9, further comprising:
a test signal coupled to the counter, the counter responsive to assertion of the test signal to start counting.

16. An integrated circuit comprising:
a summing circuit to add a digital phase offset to a digital representation of a first clock signal, the digital phase offset corresponding a phase step in the first clock signal;
a phase and frequency detector of a phase-locked loop (PLL) coupled to receive the digital representation of the first clock signal and a digital representation of a second clock signal and supply a phase error signal indicative of a difference between the first clock signal and the second clock signal;
a first zero crossing detection circuit coupled to receive the phase error and to detect a first zero crossing of the phase error after insertion of the phase offset;
a counter to determine an elapsed time between insertion of the phase offset and the first zero crossing; and
a maximum phase error circuit coupled to receive the phase error and to detect a maximum phase error overshoot resulting from insertion of the digital phase offset.

17. The integrated circuit as recited in claim 16, further comprising a processor configured to receive a count value indicative of the elapsed time and the maximum phase error overshoot and to determine a bandwidth of the PLL and a peaking characteristic of the PLL.

18. The integrated circuit as recited in claim 16, wherein the maximum phase error circuit is responsive to begin evaluating phase errors for the maximum phase error overshoot responsive to the first zero crossing.

19. The integrated circuit as recited in claim 16, wherein the first clock signal is a reference clock signal and the second clock signal is a feedback clock signal.

* * * * *